(12) United States Patent
Jung et al.

(10) Patent No.: US 7,901,871 B2
(45) Date of Patent: Mar. 8, 2011

(54) COMPOSITION CONTAINING A PHOTOACID GENERATOR MONOMER, SUBSTRATE COATED WITH THE COMPOSITION, METHOD FOR SYNTHESIZING A COMPOUND ON A SUBSTRATE USING THE COMPOSITION, AND MICROARRAY PRODUCED ACCORDING TO THE METHOD

(75) Inventors: Sung-ouk Jung, Suwon-si (KR);
Seung-ju Seo, Daejeon-si (KR);
Jae-chan Park, Daejeon-si (KR)

(73) Assignee: Samsung Electronics Co., Ltd. (KR)

( * ) Notice: Subject to any disclaimer, the term of this patent is extended or adjusted under 35 U.S.C. 154(b) by 201 days.

(21) Appl. No.: 11/971,440

(22) Filed: Jan. 9, 2008

(65) Prior Publication Data
US 2008/0213694 A1 Sep. 4, 2008

Related U.S. Application Data

(62) Division of application No. 10/895,569, filed on Jul. 20, 2004, now Pat. No. 7,387,865.

(30) Foreign Application Priority Data

Aug. 25, 2003 (KR) .................................. 2003-58782

(51) Int. Cl.
*G03F 7/30* (2006.01)
*C07C 309/06* (2006.01)

(52) U.S. Cl. ......... 430/326; 430/914; 430/926; 562/113; 564/82

(58) Field of Classification Search ............... 430/270.1, 430/926, 914; 562/113; 564/82
See application file for complete search history.

(56) References Cited

U.S. PATENT DOCUMENTS

| 6,306,555 B1 * | 10/2001 | Schulz et al. .............. 430/270.1 |
| 6,656,660 B1 * | 12/2003 | Urano et al. ............... 430/270.1 |
| 6,770,413 B1 * | 8/2004 | Ito et al. ..................... 430/270.1 |
| 7,033,728 B2 * | 4/2006 | Dammel .................... 430/270.1 |
| 7,312,014 B2 * | 12/2007 | Maesawa et al. .......... 430/270.1 |
| 7,601,480 B2 * | 10/2009 | Rahman et al. ........... 430/270.1 |
| 2002/0051933 A1 * | 5/2002 | Kodama et al. ........... 430/270.1 |
| 2004/0170918 A1 * | 9/2004 | Maesawa et al. .......... 430/270.1 |
| 2006/0165912 A1 * | 7/2006 | Koberstein et al. .......... 427/532 |

FOREIGN PATENT DOCUMENTS

WO WO 03007079 A1 * 1/2003

* cited by examiner

*Primary Examiner* — John S Chu
(74) *Attorney, Agent, or Firm* — Cantor Colburn LLP

(57) ABSTRACT

A composition containing a photoacid generator monomer and surfactant, and a method for synthesizing a compound on a substrate using the composition are provided. The method includes bonding a layer of first molecules having an acid labile protecting group to a solid substrate; coating a layer of the photoacid generator monomer composition according to the present invention on the layer of first molecules; exposing the composition layer to light and then heat-treating to remove the acid labile protecting group from the first molecules corresponding to the exposed portion; washing and removing the composition layer from the exposed and unexposed portions; and bonding second molecules to the exposed first molecules.

10 Claims, 1 Drawing Sheet

SEQUENCE LISTING

<160> NUMBER OF SEQ ID NOS: 3

<210> SEQ ID NO 1
<211> LENGTH: 10
<212> TYPE: DNA
<213> ORGANISM: Artificial Sequence
<220> FEATURE:
<223> OTHER INFORMATION: artificial peptide nucleic acid having a
      repeating N-(2-aminoethyl)-glycine unit linked by peptide bonds

<400> SEQUENCE: 1
ggagcagtct                                                          10

<210> SEQ ID NO 2
<211> LENGTH: 10
<212> TYPE: DNA
<213> ORGANISM: Artificial Sequence
<220> FEATURE:
<223> OTHER INFORMATION: artificial peptide nucleic acid having a
      repeating N-(2-aminoethyl)-glycine unit linked by peptide bonds

<400> SEQUENCE: 2
ggagtagtct                                                          10

<210> SEQ ID NO 3
<211> LENGTH: 10
<212> TYPE: DNA
<213> ORGANISM: Artificial Sequence
<220> FEATURE:
<223> OTHER INFORMATION: artificial peptide nucleic acid having a
      repeating N-(2-aminoethyl)-glycine unit linked by peptide bonds
      and a Cy3 labelled at 5' terminal

<400> SEQUENCE: 3
cctcgtcaga                                                          10

COMPOSITION CONTAINING A PHOTOACID GENERATOR MONOMER, SUBSTRATE COATED WITH THE COMPOSITION, METHOD FOR SYNTHESIZING A COMPOUND ON A SUBSTRATE USING THE COMPOSITION, AND MICROARRAY PRODUCED ACCORDING TO THE METHOD

CROSS-REFERENCE TO RELATED APPLICATIONS

This application is a division of U.S. patent application Ser. No. 10/895,569, filed Jul. 20, 2004, which claims priority to Korean Patent Application No. 2003-58782 filed on Aug. 25, 2003 in the Korean Intellectual Property Office, both of which are incorporated herein by reference in their entirety.

BACKGROUND OF THE INVENTION

1. Field of the Invention

The present invention relates to a composition containing a photoacid generator monomer, a solid substrate coated with the composition, a method for synthesizing a compound on a substrate using the composition, and a microarray produced according to the method.

2. Description of the Related Art

Methods for synthesizing a biopolymer on a substrate have been well known for years. In one example, Fordor et al. teaches a new synthesis technique where nucleic acid or amino acid having an UV-labile protecting group is attached on a solid surface. The protecting group is removed by exposing the selected regions of the solid surface to light using a photolithographic mask, which is subsequently reacted with a new nucleic acid or amino acid having a photolabile protecting group, to polymerize the nucleic acid or amino acid at a specific location (see U.S. Pat. Nos. 5,445,934 and 5,744,305). Since this method allows selective synthesis of oligonucleotide probes with a specific sequence/length at a specific location, it is useful in synthesizing various oligonucleotide probes with a desired sequence and length at a predetermined position. Also, since this method employs an ultra-fine processed mask used in semiconductor devices, it is extremely useful for fabricating oligonucleotide probes in high density. Fordor et al. also suggested that a sequencing method using the oligonucleotide probes, which is much easier and faster than Sanger's method, is useful for making high-density oligonucleotide probes. However, the removal of a photolabile protecting group is proportional to the power of a light source, which plays a detrimental role in the ultra-fine process for making high-density chips.

On the other hand, photolithographic process using photoresist (hereinafter referred to as 'PR'), which is used for micropattern formation in the semiconductor industry, has attracted attention as an essential technique to improve the density of a DNA chip. Since the size or capacity of a semiconductor chip is dependant on the spatial resolution of the photolithographic process, such process has played a leading role in the semiconductor and microelectronics industry. Photolithographic process utilizes the solubility differences of PR between the light-exposed region and the unexposed region. A solubility reduction in the exposed region is referred to as a negative system, and a solubility increase is referred to as a positive system and is used mostly for the production of semiconductor chips. By using the above photolithographic process, more oligonucleotide probes can be arrayed on a limited chip area. Up to now, the photolithographic process has been applied in a method using a general PR system (see U.S. Pat. No. 5,658,734) and a method using a micromirror. Photolithographic process using a PR system (hereinafter referred to as a 'PR process') has an advantage of using materials already developed or commercialized for the semiconductor industry. According to the process, a pattern is formed by the light exposure, washed out to lead to standard solid-phase nucleic acid synthetic reaction on the surface, and finally linked to nucleotides. The PR includes diazoquinone/cresol-novolac, highly adhesive to a surface, which is shown to have good pattern characteristics in i-line (365 nm) and is used in 16 megabyte DRAM processing. However, the PR is developed in an alkaline solution ([OH$^-$]>0.1M), which causes the cleavage of an amide bond protecting the amino group of base. The protecting coating under PR has been suggested to overcome the said problem of development (see J. Vac. Sci. Tech., B7(6):1734, 1989).

The PR process consists of three major steps. The first step is mainly the PR pattern formation by PR coating, light exposure, and developing. The second step is the removal of a protecting group in the exposed and etched region and the PR by acidic solution. The third step is the sequential attachment of nucleic acid and a post-treatment. The PR process has a disadvantage of complex processing as described above.

To overcome this downside of the PR process, a photoacid patterned array (PPA) system had been proposed (see U.S. Pat. No. 5,658,734). The PPA system uses a polymer matrix mixed with a photoacid generator (hereinafter referred to as 'PAG'). In this PPA system, acids are generated only at the exposed region, and the removal of a protecting group occurs after heat treatment. Therefore, the two separate steps employed in the PR process can be carried out in one step. However, this PPA system has revealed several problems as well. For example, acids generated by the PPA system remain in the polymer matrix, and more PAG should be added. An excess amount of PAG scatters light, which in turn interferes with micro pattern formation. Furthermore, the polymer matrix (a film of a mixture of polymer and PAG) has to be removed using an organic solvent such as acetone or methylethylketone (MEK), for which reprocessing and recovery is expensive.

Another method for manufacturing a DNA chip using photolithography is one using a micromirror. This method comprises coating on a solid substrate using PR which is capable of reacting with oligonucleotides, adding a solution of a photoacid generator to the wall, and exposing a predetermined portion to light using a micromirror to generate acids. Thus, the generated acids may remove a protecting group attached to the oligonucleotides, thus allowing the reaction of the oligonucleotides. Repeating the above steps allows layering oligonucleotides in a desired pattern. This method for manufacturing a chip is simple compared with the PR method. But, this method has disadvantages: the reaction of the photoacid generator is carried out in solution, thus resulting in a difficulty in manufacturing a high density chip, and the cost of equipment is high.

To overcome the problems of the prior art, U.S. Pat. No. 6,359,125 discloses a method for preparing arrays of peptide nucleic acid (PNA) on a solid substrate using a polymeric photoacid generator, in place of the photoacid generator in a polymer matrix. However, the use of a polymeric photoacid generator, which involves a further step of polymerizing monomers, results in a high production cost and complicated processes. Thus, there is still a need for a photoacid generator which can be easily produced at low cost using conventional methods and has high acid-generating efficiency. The present inventors conducted research to overcome these problems and discovered a photoacid generator monomer of the present invention.

SUMMARY OF THE INVENTION

The present invention provides a composition containing a photoacid generator monomer, which is capable of being coated on a substrate.

According to an aspect of the present invention, there is provided a substrate coated with the composition.

According to another aspect of the present invention, there is provided a method for synthesizing a compound on a substrate using the composition.

According to still another aspect of the present invention, there is provided a microarray produced using the above method.

BRIEF DESCRIPTION OF THE DRAWING

The above and other features and advantages of the present invention will become more apparent by describing in detail exemplary embodiments thereof with reference to the attached drawing in which.

DETAILED DESCRIPTION OF THE INVENTION

Figure 1:
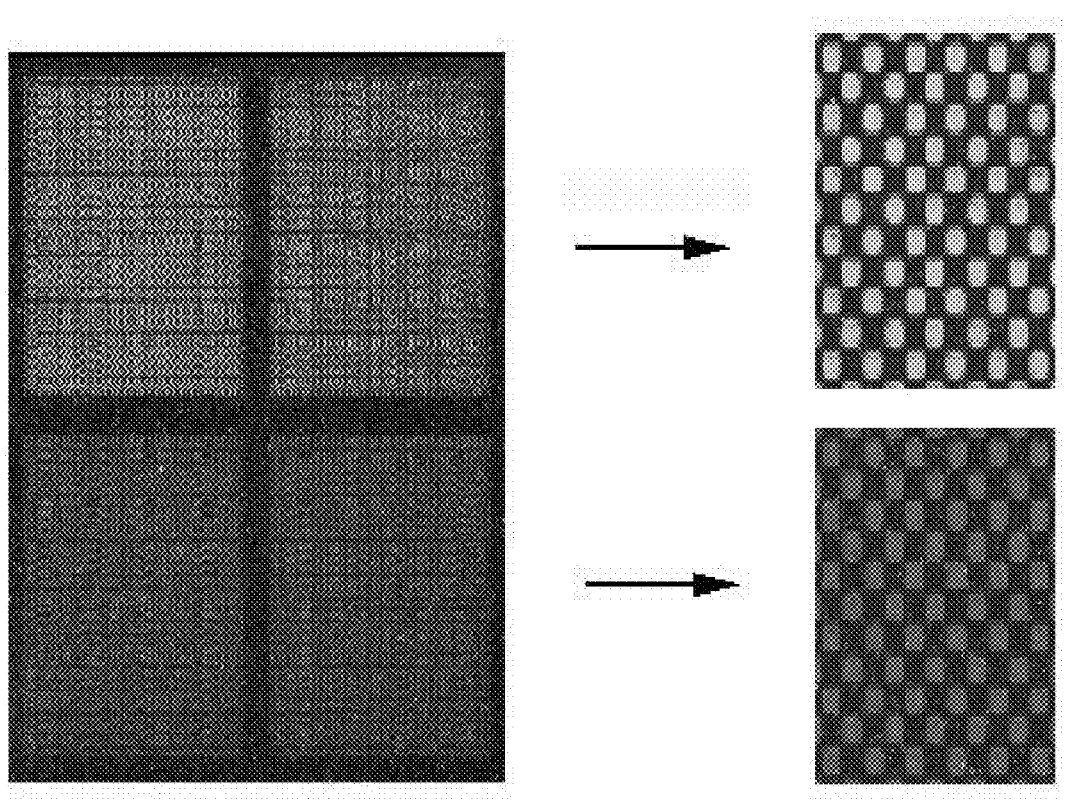
FIG. 1 is a view of illustrating the experimental result of desired oligonucleopeptides synthesized according to a method of the present invention.

The present invention provides a composition containing a photoacid generator monomer and nonionic surfactant. The photoacid generator monomer comprises a series of sulphonium or iodonium photoacid generators. Preferably, the sulphonium photoacid generator monomer may be represented by one of the following formulae I though III:

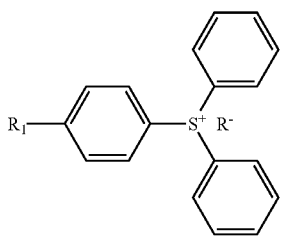

(I)

wherein $R^-$ is $CF_3SO_3^-$ or $C_4F_9SO_3^-$ and $R_1$ is $CH_3$;

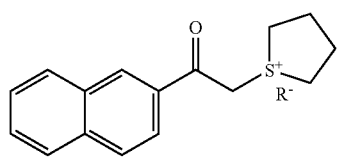

(II)

wherein $R^-$ is $CF_3SO_3^-$ or $C_4F_9SO_3^-$;

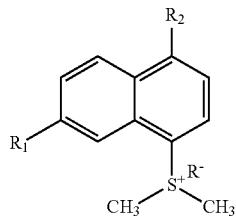

(III)

wherein $R^-$ is $CF_3SO_3^-$, $C_4F_9SO_3^-$, $CF_3(CF_2)_3SO_3^-$ or p-$TSO^-$, $R_1$ is hydroxy or H, and $R_2$ is hydroxy or H.

Also, the iodonium photoacid generator may be represented by either of the following formulae IV and V:

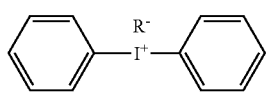

(IV)

wherein $R^-$ is $CF_3SO_3^-$ or $C_4F_9SO_3^-$,

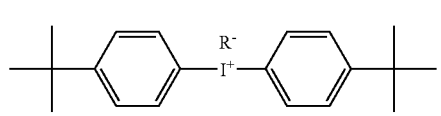

(V)

wherein $R^-$ is $CF_3SO_3^-$, $C_4F_9SO_3^-$, or p-$TSO^-$.

In the present invention, the nonionic surfactant comprises a fluorine-based surfactant. Preferably, the surfactant is 100% of fluoroaliphatic polymer ester or a mixture of 95% of fluoroaliphatic polymer ester and 5% of N-methylpyrrolidone (NMP).

The photoacid generator monomer and surfactant of the present invention may be dissolved in an amount of 5 to 50% (w/v) in a suitable organic solvent, such as N-methylpyrrolidone (NMP). The amount of surfactant is preferably 1,000 to 1,500 ppm. Also, the amount of photoacid generator monomer is preferably 1,000 to 100,000 ppm.

If the photoacid generator monomer composition is exposed to UV light, it can generate acids. The composition may be coated on a solid substrate without polymerization.

Also, the present invention provides a solid substrate coated with the photoacid generator monomer composition. The solid substrate may include, for example, silicone, glass, surface-treated glass, polypropylene, or activated acrylamide.

Further, the present invention provides a method for synthesizing a compound on a substrate. The method comprises bonding a layer of first molecules having an acid labile protecting group to a solid substrate; coating a layer of the photoacid generator monomer composition according to the present invention on the layer of first molecules; exposing the composition layer to light and then heat-treating to remove the acid labile protecting group from the first molecules corresponding to the exposed portion; washing and removing the composition layer from the exposed and unexposed portions; and bonding second molecules to the exposed first molecules.

In the present invention, the solid substrate include silicon dioxide, borosilicate glass, organic polymers such as polypropylene or activated acrylamide, and other solid substrates known to those skilled in the art which have a surface bearing reactive sites suitable for immobilizing a layer of molecules having a labile protecting group. The compounds to be synthesized may be nucleic acids or proteins. The term nucleic acid is intended to include DNA, RNA, PNA (peptide nucleic acid), or LNA (locked nucleic acid). The term PNA is intended to mean nucleic acid analogues having a backbone comprised of N-(2-aminoethyl)-glycine repeating units linked via peptide bonds, with bases being linked to the backbone via methylene carbonyl bonds.

In the first step of the present method, the layer of first molecules are bonded to the solid substrate. The first molecules may be linker molecules (or linkers). Linkers suitable for glass substrate include molecules having both (i) a functional group capable of attaching linkers to a substrate (for example, the alkoxysilane group) and (ii) a functional group having an active site capable of attaching linkers to other molecules (for example, the hydroxy group). Examples of linkers include aminoalkyl carboxylic acid, such as omega-aminocaproic acid. Further, the term acid labile group means a protecting group which can be removed by acids. Examples of protecting groups include a substituted trityl group, such as triphenylmethyl(trityl) and dimethoxytrityl (DMT); however, any acid labile protecting group known to those skilled in the art can be used.

In the coating step of the present invention, the layer of the photoacid generator monomer composition according to the present invention is coated on the layer of first molecules, bonded to the substrate in the preceding step. The photoacid generator monomer and surfactant are the same as explained above. The coating step can be performed using any method known in the art. For example, spin coating can be used. The thickness of the layer of the photoacid generator monomer composition is about 0.1 to 1 μm, preferably about 0.3 to 0.5 μm.

In the exposing step of the present method, the composition layer formed in the coating step is exposed to light and then heat-treated to remove the acid labile protecting group from the first molecules corresponding to the exposed portion. Exposing may be performed via a mask of a predetermined pattern. Exposing may also be performed using a micromirror instead of a mask (see U.S. Pat. No. 6,426,184, the disclosure of which is incorporated herein by reference). Any range of wavelength of light can be used. Preferably, the light used has a wavelength of 150 to 400 nm with a wavelength of 365 nm being most preferred. The heat-treating step accelerates diffusion of $H^+$ ions generated by the photoacid generators and thus removes the acid labile protecting groups from the first molecules. The heat-treatment may be performed for 0.5 to 3 min, preferably 1 min, at a temperature of 60 to 100° C., preferably 80° C. However, the heat-treatment is not limited to the above conditions.

The method of the present invention may further comprise soft-baking to remove organic solvents in the photoacid generator monomer composition, prior to the exposing step. Soft-baking may be performed for 0.5 to 2 min, preferably 1 min, at 30 to 110° C., preferably 60° C.

In the washing and removing step of the present invention, the composition layer in the exposed portion and the unexposed portion is washed and removed using an organic solvent. A polar organic solvent, preferably one in which the photoacid generators can be dissolved, may be used as the washing solvent. For example, a washing solution may be a solution of dimethylformamide (DMF) in methanol.

In the next step of the present method, the second molecules are selectively bonded to the first molecules, from which the acid labile protecting groups have been removed by exposure and heat-treatment. The bonding site of a first molecule is, for example, a hydroxy (R—OH) group reactive to a phosphoramidite coupling agent. Another example of a bonding site is a primary amide group used in synthesis of polypeptides. Also, bonding sites include, but are not limited to, other functional groups, such as ketones and aldehydes, which can be protected and unprotected for bonding reactions.

The second molecules may be molecules including monomers, dimers, trimers, and oligomers of proteins or nucleic acids. The second molecules are preferably those having an acid labile protecting group. Suitable monomers include L and D amino acids, nucleotides, peptides, and synthetic nucleotide analogues in protected and activated forms. Preferred monomers include the following nucleotides: adenosine phosphate, guanosine phosphate, cytidine phosphate, uridine phosphate, deoxyadenosine phospate, deoxyguanosine phosphate, deoxycytidine phosphate, and deoxythymidine phosphate in protected and activated forms, as well as mimetics thereof. The nucleotides in activated forms include, for example, phosphoramidite nucleotide molecules. Examples of the second molecules are not limited to the ones listed above and can include ones that are easily available to those skilled in the art and which depend on polymers, including DNA, RNA, PNA, LNA and polypeptide, to be synthesized. The protecting groups and activated groups used for bonding reactions are dependant on the specific synthesis reactions, which are well known to those skilled in the art. Examples of the second molecules for bonding to the first molecules and examples of the process for bonding are disclosed in Fodor et al., Science, 251, p. 767 (1991), the disclosure of which is incorporated herein by reference.

The method of the present invention may be repeated until the compounds having the desired number or length are synthesized on the substrate.

After the compounds having the desired number or length are synthesized in the form of an array, the protecting groups on the compounds are preferably removed.

In addition, the present invention provides a microarray produced according the method of the present invention. The microarray can be produced by synthesizing a predetermined number of compounds in a predetermined region according to the method.

Hereinafter, the present invention will be described in more detail by means of the following examples. The examples are presented for illustrative purposes only and are not intended to restrict the scope of the invention.

EXAMPLES

Example 1

Test of the Coating Property of the Composition Containing the Photoacid Generator Monomer and Surfactant In this example, various compositions containing a photoacid generator monomer and surfactant were produced and estimated for their coating property on a solid substrate.

First, a photoacid generator monomer (dihydroxynaphtholdimethylsulphone toluene sulphonium salts) was mixed with various surfactants, as listed in the following table 1, respectively, wherein the weight ratio of the photoacid generator monomer to the surfactant ranged from 100:1 to 500:1. Then, the photoacid generator monomer compositions obtained were respectively coated on a solid substrate of glass or silicone wafer. Coating was carried out using a spin-coating method. The photoacid generator monomer compositions were spin-coated on the substrate at 2,000 rpm for 20 sec.

TABLE 1

Surfactants used and the results of coating property

| Manufacturer | Trade name | | Form | Coating property |
|---|---|---|---|---|
| | F-127 | | Solid | X |
| | AcSi | | Liquid | X |
| | Ac | | Liquid | X |
| | MSQ | | Solid | X |
| Aldrich | 435457 | Poly(ethylene glycol)-B-poly(propylene glycol)-B-poly(ethylene glycol) MN4400 | Liquid | X |
| Aldrich | 435465 | Poly(ethylene glycol)-B-poly(propylene glycol)-B-poly(ethylene glycol) MN5800 | Gas | X |
| Aldrich | 858366 | BRIJ 35 (polyoxyethylene(23) lauryl ether) | Solid | X |
| Aldrich | 235989 | BRIJ 33 | Liquid | X |
| Aldrich | 38858 | BRIJ 56 | Solid | X |
| Aldrich | 435430 | Poly(ethylene glycol)-B-poly(propylene glycol)-B-poly(ethylene glycol) MN2800 | Liquid | X |
| | Tween 80 | Nonionic polyethylene type | Liquid | X |
| | Tween 20 | Nonionic polyethylene type | Liquid | X |
| | FC-4430 | 100% Fluoroaliphatic polymer ether | | ○ |
| | FC-4432 | 95% Fluoroaliphatic polymer ether, 5% NMP | | ○ |

As seen from Table 1, the composition containing the photoacid generator monomer and the fluorine-base surfactant according to the present invention may be coated on a solid substrate.

Example 2

Production of an Array of Peptide Nucleic Acids (PNAs) Using the Photoacid Generator Monomer Composition of the Present Invention (1) Coating of the First Molecules on Solid Substrate.

First, a glass substrate was immersed in a cleaning solution (containing 1 L of an aqueous solution of 95% ethanol, 12 mL of water and 120 g of NaOH) for 12 hours, rinsed several times with water, and air-dried.

Then, the dried glass substrate was surface-treated for fixing amino groups, as follows: the dried glass substrate was rinsed with an aqueous solution of 95% ethanol, introduced into a solution of 0.1% (v/v) aminopropyltriethoxysilane in ethanol, and stirred for 5 min at room temperature. Next, the substrate was rinsed again with ethanol three times and dried in a vacuum oven at 120° C. for 20 min. Then, the glass substrate was placed in an atmosphere of argon gas for 12 hours, immersed in DMF, and rinsed with a sufficient amount of dichloromethane.

Subsequently, added to the surface-treated glass substrate were 0.5 mL of a DMP solution containing 30 mm of 6-N-t-butoxycarbonylaminocaproic acid and 3 g of dicyclocarbodiimide (DCC) and reacted while agitated for 1 hour at 80° C. Then, an unreacted amine group was capped with acetyl group by reacting in an acetic acid anhydride/pyridine (1:3, v/v) solution for 1 hour with stirring. Then, linkers, in which the amine group was protected with an acid labile protecting group, were attached to the substrate.

(2) Coating of the Composition of the Present Invention and Synthesis of Peptide Nucleic Acids.

0.05 g of a photoacid generator monomer dihydroxynaphtholdimethylsulphone toluene sulphonium salt and 0.001 g of FC-4432 surfactant (3M Company, U.S.A.) were mixed and then dissolved in N-methylpyrrolidone (NMP) at a concentration of 10% (w/v) to obtain a photoacid generator monomer composition. Then, the composition was spin-coated at 3,000 rpm onto the glass substrate, to which the linkers were attached, prepared in Example 2(1).

The coated glass substrate was soft-baked for 1 min at 80° C., exposed to white light having a short wavelength for 10 seconds using a photomask, and post-baked for 2 min at 80° C. to generate acids and selectively remove the protecting group from the first molecules in the exposed portions. Added to this were 3 g of peptide nucleic acid monomers such as those commercially available from Perseptive Biosystems (USA), for example N-(2-t-butyloxycarbonyl-aminoethyl)-N-thymine-1-ylacetyl)glycin, N—(N-4-(benzyloxycarbonyl)cytosin-1-yl)acetyl-N-(2-t-butyloxycarbonyl-aminoethyl)glycin, N—(N-6-(benzyloxycarbonyl)adenin-9-yl)acetyl-N-(2-t-butyloxycarbonyl-aminoethyl)glycin, N—(N-4-(benzyloxycarbonyl)guanine-1-yl)acetyl-N-(2-t-butyloxycarbonyl-aminoethyl)glycin, and the like, dissolved in 0.5 mL of DMF, and 10 mg of HATU, and then they were reacted at 60° C. for 2 hours with agitation. The peptide nucleic acid monomers were added in such order that the finally obtained nucleopeptide had the sequence ID No. 1.

Then, an unreacted amine group was capped with acetyl group by reacting it in an acetic acid anhydride/pyridine (1:3, v/v) solution for 1 hour with agitation. After the reaction, the residual photoacid generator monomer composition was removed using 1% of trialkylammonumhydroxide and an organic solvent (DMF, MeOH).

Next, the steps of coating the photoacid generator monomer composition, exposing the substrate to light via a photomask to remove a protecting group, reacting the exposed portion with peptide nucleic acids having a protected amine group and capping, were repeated until peptide nucleic acids having the desired length are synthesized on the substrate. Free amine groups on the glass substrate were fluorescence-labeled by reacting with 1 mm of fluoresin isothiocyanate (Adrich, U.S.A.) in DMF for 1 hour at room temperature, washed with ethanol, water and ethanol sequentially, and dried and stored in a dark room. A microscopic image with a resolution of a 10 μm scale can be obtained by analyzing the substrate with a spectrofluorometer.

The probes of oligopeptide nucleic acid having sequence ID No. 2 with a different base from peptide nucleic acid having sequence ID No. 1 were synthesized on the substrate using the same process as described above to produce a microarray of oligopeptide nucleic acid probes. The microarray had 10,000 spots of the peptide nucleic acid having a length of 80 μm. The DNA of sequence ID No. 3 with labeled Cy3 at a 5' position was hybridized with the peptide nucleic acids on the microarray under the hybridization conditions and scanned with a scanner (Axon scanner).

The result showed that spots having a good shape and without edges formed on the respective microarray, as illustrated in FIG. 1. The upper left portion of FIG. 1 shows a perfect match between probes and targets, and the upper right portion of FIG. 1 shows its magnified image. The lower left portion of FIG. 1 shows a mismatch between probes and targets in one base, and the lower right portion of FIG. 1 shows its magnified image. Fluorescence intensity of both cases, i.e., perfect match and mismatch, and its ratio are shown in the following Table 2.

TABLE 2

| Target | Average of fluorescence intensity | Ratio (PM/MM) |
|---|---|---|
| Perfect match (PM) | 3145 | 6.33 |
| Mismatch in one base(MM) | 497 | |

Thus, PNA may be synthesized on the substrate by direct coating of the photoacid generator monomer composition of the present invention on the substrate without polymerization, exposure of the substrate, and coupling reaction with suitable PNA monomers.

The photoacid generator monomer composition of the present invention may be coated on a substrate without polymerization.

The synthesis method of compounds on a substrate may be simplified by using the substrate coated with the photoacid generator monomer composition of the present invention.

Whereas the conventional synthesis method comprises coating of a photoresist composition and exposing and developing, the present method comprises coating of the photoacid generator monomer composition and exposing, thus allowing a simpler process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photoacid generator monomer composition consisting of:
a photoacid generator monomer represented by one of the following formulae IV and V:

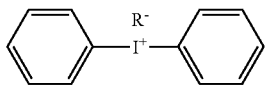

wherein R⁻ is $CF_3SO_3^-$ or $C_4F_9SO_3^-$,

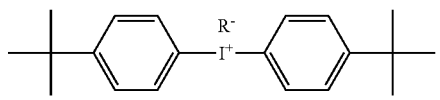

wherein R⁻ is $CF_3SO_3^-$, $C_4F_9SO_3^-$, or p-TSO⁻;
a nonionic surfactant; and
N-methylpyrrolidone.

2. The composition of claim 1, wherein the nonionic surfactant is a fluorine-based surfactant.

3. The composition of claim 2, wherein the nonionic surfactant is 100% of a fluoroaliphatic polymer ester or a mixture of 95% of fluoroaliphatic polymer ester and 5% of N-methylpyrrolidone (NMP).

4. A solid substrate coated with the composition of claim 1.

5. The solid substrate of claim 4, wherein the solid substrate is formed of silicone, glass, surface-treated glass, polypropylene, or activated acrylamide.

6. A method for synthesizing a compound on a substrate, the method comprising:
bonding a layer of first molecules having an acid labile protecting group to a solid substrate;
coating a layer of the photoacid generator monomer composition of claim 1 on the layer of first molecules;
exposing the composition layer to light and then heat-treating it to remove the acid labile protecting group from the first molecules corresponding to the exposed portion;
washing and removing the composition layer from the exposed and unexposed portions and
bonding second molecules to the exposed first molecules.

7. The method of claim 6, wherein the substrate is silicone, glass, surface-treated glass, polypropylene, or activated acrylamide.

8. The method of claim 6, wherein the compound synthesized is a nucleic acid or a protein.

9. The method of claim 8, wherein the nucleic acid is DNA, RNA, PNA or LNA.

10. The method of claim 6, wherein the second molecule is a monomer of a protein or a nucleic acid.

* * * * *